(12) United States Patent
Mohtar et al.

(10) Patent No.: US 6,312,265 B1
(45) Date of Patent: Nov. 6, 2001

(54) DOUBLE-SIDED SINGLE-PRINT STRADDLE MOUNT ASSEMBLY

(75) Inventors: Arman Mohtar; Tiang Fee Yin, both of Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/648,519

(22) Filed: Aug. 25, 2000

Related U.S. Application Data

(60) Provisional application No. 60/151,197, filed on Aug. 27, 1999, and provisional application No. 60/162,266, filed on Oct. 28, 1999.

(51) Int. Cl.⁷ ................................................. H01R 12/00
(52) U.S. Cl. ............................. 439/79; 439/59; 439/876; 439/83
(58) Field of Search ................................. 439/79, 62, 59, 439/83, 931, 80, 876, 951, 636; 29/840, 832

(56) References Cited

U.S. PATENT DOCUMENTS

| | | |
|---|---|---|
| 4,511,076 | 4/1985 | Roth . |
| 4,734,042 | 3/1988 | Martens et al. . |
| 4,737,115 * | 4/1988 | Seidler .................................. 439/876 |
| 4,761,881 | 8/1988 | Bora et al. . |
| 4,972,989 | 11/1990 | Black et al. . |
| 5,096,435 | 3/1992 | Noschese et al. . |
| 5,137,205 | 8/1992 | Inohara et al. . |
| 5,259,767 * | 11/1993 | Kurbikoff et al. ...................... 439/59 |
| 5,261,989 | 11/1993 | Ueltzen . |
| 5,373,984 | 12/1994 | Wentworth . |
| 5,482,474 | 1/1996 | Yohn et al. . |
| 5,600,102 | 2/1997 | Socha . |
| 5,615,477 | 4/1997 | Sweitzer . |
| 5,722,160 | 3/1998 | Uemura et al. . |
| 5,816,830 | 10/1998 | Griffith et al. . |
| 5,897,386 * | 4/1999 | Baxter et al. ........................... 439/79 |
| 5,904,581 | 5/1999 | Pope et al. . |
| 6,049,656 | 4/2000 | Kim et al. . |
| 6,056,603 | 5/2000 | Pauza . |
| 6,062,892 | 5/2000 | Meng et al. . |
| 6,227,867 * | 5/2001 | Chen et al. ............................ 439/59 |

* cited by examiner

*Primary Examiner*—Tho D. Ta
(74) *Attorney, Agent, or Firm*—Derek J. Berger; Jonathan E. Olson; Shawn B. Dempster

(57) ABSTRACT

The present invention provides for an improved printed circuit board assembly. The connector is straddle mounted to an edge of a printed circuit board with first connector leads configured for abutment with a primary surface of the printed circuit board (PCB) and second connector leads configured for abutment with a secondary surface of the PCB. Holes are provided in the PCB between the first connector leads. The second connector leads are arranged to abut the PCB directly where the holes open on the secondary surface. Solder is deposited on only the primary surface of the PCB directly on the locations where bond formation is desired between the first connector leads and the PCB, that is, on first contact pads. Solder is deposited in the same process on the primary surface, directly above the locations where bond formation is desired between the second connector leads and the PCB, that is, directly above the second contact pads on the other surface of the PCB. The holes are preferably plated through holes, in which case solder bonds may also be formed formed between the connector leads and the walls of the holes, thereby providing strengthened bond formation.

9 Claims, 4 Drawing Sheets

DOUBLE-SIDED SINGLE-PRINT STRADDLE MOUNT ASSEMBLY

RELATED APPLICATION

The present application claims benefit of the U.S. provisional patent application No. 60/151,197, filed Aug. 27, 1999, and the U.S. provisional patent application No. 60/162,266, filed Oct. 28, 1999.

FIELD OF THE INVENTION

The present invention is generally directed to printed circuit board processes and products. More particularly, the invention relates to a connector and the manufacture of a printed circuit board assembly for use with electronic products.

BACKGROUND OF THE INVENTION

In most printed circuit (wire) assembly boards, the use of a straddle mount connector is preferred owing to the robustness of the assembly, space limitations and other constraints. A double sided straddle mount connector typically includes a housing with one or more rows of connector leads extending from one side of the housing for making electrical contact with the respective contact pads; on both surfaces of a printed circuit board (PCB), whereas a single sided straddle mount connector has all its connector leads in contact with only one surface of the PCB.

Whilst much has been done to improve the methods of mounting semiconductor devices to a PCB, the same cannot be said for straddle mount connectors. Compared to components such as semiconductor integrated-circuit devices which can be placed on the PCB surface by some pick-and-place action, the mounting of a straddle mount connector is complicated by the fact that there will be a certain amount of sliding of the connector leads against the PCB surfaces as the connector is pushed against the edge of the PCB. The conventional method is to apply solder to one PCB surface and then to flip the PCB over for solder to be applied to the other PCB surface. The connector is then forced into position along the edge of the PCB before the assembly is sent for solder reflow.

One example of a connector is described by Pauza in the U.S. Pat. No. 6,056,603 issued May 2, 2000. Pauza suggests that an alternating up and down configuration of the connector leads allows for excellent position control between the connector leads. However, as in other double sided straddle mount connectors, such as that proposed by Martens et al in the U.S. Pat. No. 4,734,042 issued Mar. 29, 1998, at least two solder printing processes are required for both surfaces of the PCB.

One way of getting around the need to carry out solder printing on both surfaces of the PCB is to use the method taught by Socha in the U.S. Pat. No. 5,600,102 issued Feb. 4, 1997. Socha suggests the use of a solder preform which can be wrapped about the edge of a PCB to provide solder on both surfaces of the PCB. Taking into consideration the cost of purchasing the solder preform and of introducing new processes in the existing manufacturing line to wrap the solder preform onto the PCB, this does not seem to be a cost-saving solution for the manufacturer.

Significant savings can of course be achieved if the number of printing processes can be reduced. One way of doing so is disclosed by Ueltzen in the U.S. Pat. No. 5,261,989 issued on Nov. 16, 1993 and entitled "Straddle Mounting an Electrical Conductor to a Printed Circuit Board". In this patent, additional solder is deposited in reservoirs on one PCB surface and then ducted to the second PCB surface. However, in reality, it is found that the solder does not travel well across the second PCB surface to the locations where bond formation is desired. In particular, there is inadequate fillet formation around the connector leads further away from the reservoirs, leading to poor electrical contact.

Furthermore, the area that is taken up by the reservoirs is considered underutilized as it cannot be used for mounting other devices. As the demand for miniaturization and more integrated products increase, especially in the area of consumer electronics, there is a need to conserve the valuable real estate on the PCB. If all the required devices cannot be mounted to one surface of the PCB and some have to be mounted to the second surface, this means that two solder printing processes have to be carried out. The result is that the original purpose of having the reservoirs is not achieved, and ironically, manufacturing cost is increased.

An alternative is to use single sided straddle mount connectors such as one described by Baxter et al. in the U.S. Pat. No. 5,897,386 issued Apr. 27, 1999 entitled "Single-Sided Electronic Connector and Method of Assembly". Since all the leads of the connector contact only one surface of the PCB, a second process to deposit solder on the second surface of the PCB becomes unnecessary. Unfortunately, the required pitch of the leads in a single sided connector tends to create serious solder defects such as bridging and insufficient solder. Bridging occurs when solder is pushed aside by the connector leads as the connector is assembled to an edge of the PCB. The solder for neighboring leads may thus merge and create a short in the circuit. In addition, the solder from a first contact pad may be drawn to the solder at an neighboring contact pad because of surface tension effects. The first contact pad is thus left with insufficient solder to form a good joint between the contact pad and the connector lead. In addition, single sided connectors are generally not favored over double sided connectors because they tend to be associated with PCB warpage problems.

It is generally difficult to reduce the number of solder printing processes without sacrificing product quality or increasing manufacturing costs. There is a clear need for an improved straddle mount assembly that facilitates more efficient use of the limited surface area on the PCB at reduced manufacturing costs, whilst producing more consistent quality products. These and other advantages are offered by the present invention, which at the same time provides a solution to other problems faced by the prior art.

SUMMARY OF THE INVENTION

The present invention provides for an improved printed circuit board assembly. The connector is straddle mounted to an edge of a printed circuit board with first connector leads configured for abutment with a primary surface of the printed circuit board (PCB) and second connector leads configured for abutment with a secondary surface of the PCB. Holes are provided in the PCB between the first connector leads. The second connector leads are arranged to abut the PCB directly where the holes open on the secondary surface. Preferably the first connector leads and the second connector leads are offset to provide clearance on either one surface of the PCB. Solder is deposited on only the primary surface of the PCB directly on the locations where bond formation is desired between the first connector leads and the PCB, that is, on first contact pads. Solder is deposited in the same process on the primary surface, directly above the locations where bond formation is desired between the second connector leads and the PCB, that is, directly above the second contact pads on the other surface of the PCB. The holes are preferably plated through holes, in which case solder bonds may also be formed formed between the connector leads and the walls of the holes, thereby providing strengthened bond formation.

The provision of solder directly over the second contact pads provide for vastly improved solder bonds on the secondary surface. In addition, the location of the holes next to or in the midst of the first connector leads requires the minimum area for the assembly of the connector to the printed circuit board. The present invention further provides for the use of double sided straddle mount connectors in conjunction with a single solder printing process. The present invention enables the use of current manufacturing set-up without the need for new intermediate materials or processes. Not only can manufacturing costs be reduced, several problems associated with the prior art, for example, poor solder flow, PCB warpage, bridging and insufficient bond formation, can now be averted.

DETAILED DESCRIPTION

Figure 1:
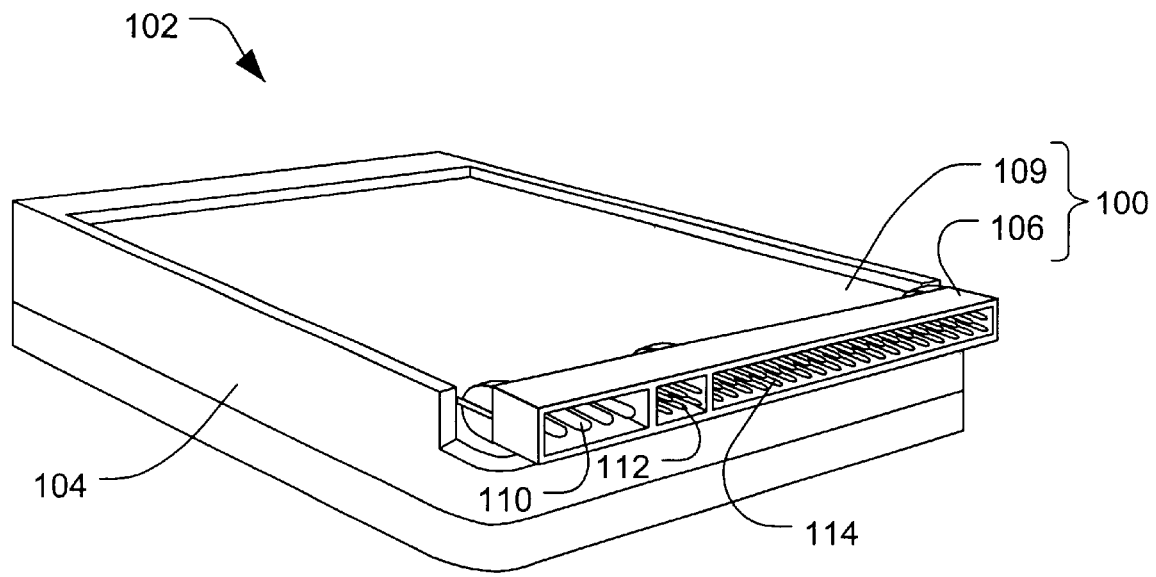
FIG. 1 shows a printed circuit board assembly (PCBA) as mounted to an electronic product.

It is to be understood that the present invention is applicable to various products in which printed circuit boards are utilized. For the purpose of illustration, FIG. 1 shows a printed circuit board assembly (PCBA) 100 in a disc drive application. The PCBA is typically found mounted to one side of the disc drive 102, outside the disc drive casing 104. The PCBA includes devices and circuits for controlling the activities of the disc drive. A connector 106 is mounted to one edge 108 of the printed circuit board (PCB) 109 and provides for communication to an external system.

Figure 2:
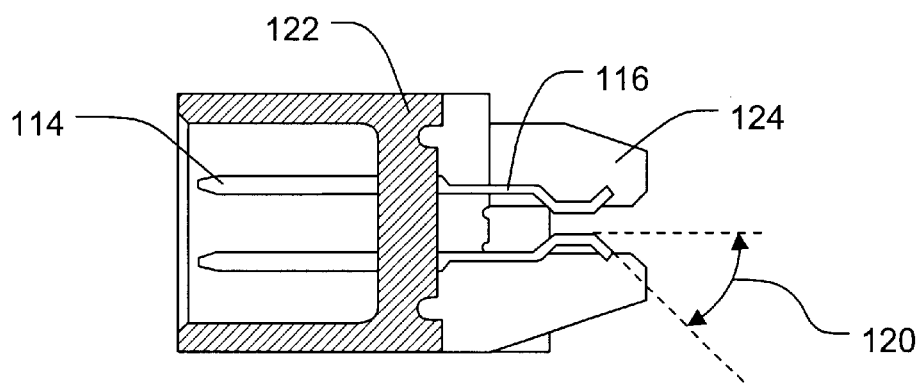
FIG. 2 is a cross-sectional view of a connector.

Various kinds of connectors are used, depending on the communication standard chosen for the disc drive, of which the SCSI (small computer system interface) interface and the AT interface are only two examples. For illustration, the disc drive in FIG. 1 is shown with a connector for AT interface. It includes pins for the power supply 110, the configuration 112, and the input/output interface 114. Regardless of the communication standard chosen, the connector will have connector leads 116 for electrical connection with the circuitry on the PCB. The cross-sectional view of FIG. 2 reveals that each pin has a corresponding connector lead extending from the connector in a direction away from the pin. The connector leads are configured for forming electrical contact with a series of contact pads laid out on the PCB, near the edge of the PCB. For a particular communication standard, there is therefore a standard number of connector leads that must be soldered to the contact pads on a standard size PCB. The exact configuration of the connector leads may vary, depending on the application. For example, the connector leads may be angled outward to better receive the PCB. A desired angle 120 ranges from about 30 degrees to 45 degrees. The connector leads may extend from the housing in one or more rows. The pins and connector leads are supported by a housing 122 usually made of some polymer or non-conductive material. When the connector is mounted to the PCB, the housing extends along the edge of the PCB. The housing may include gripper arms 124 or fasteners for securing the connector to the PCB.

Figure 3:
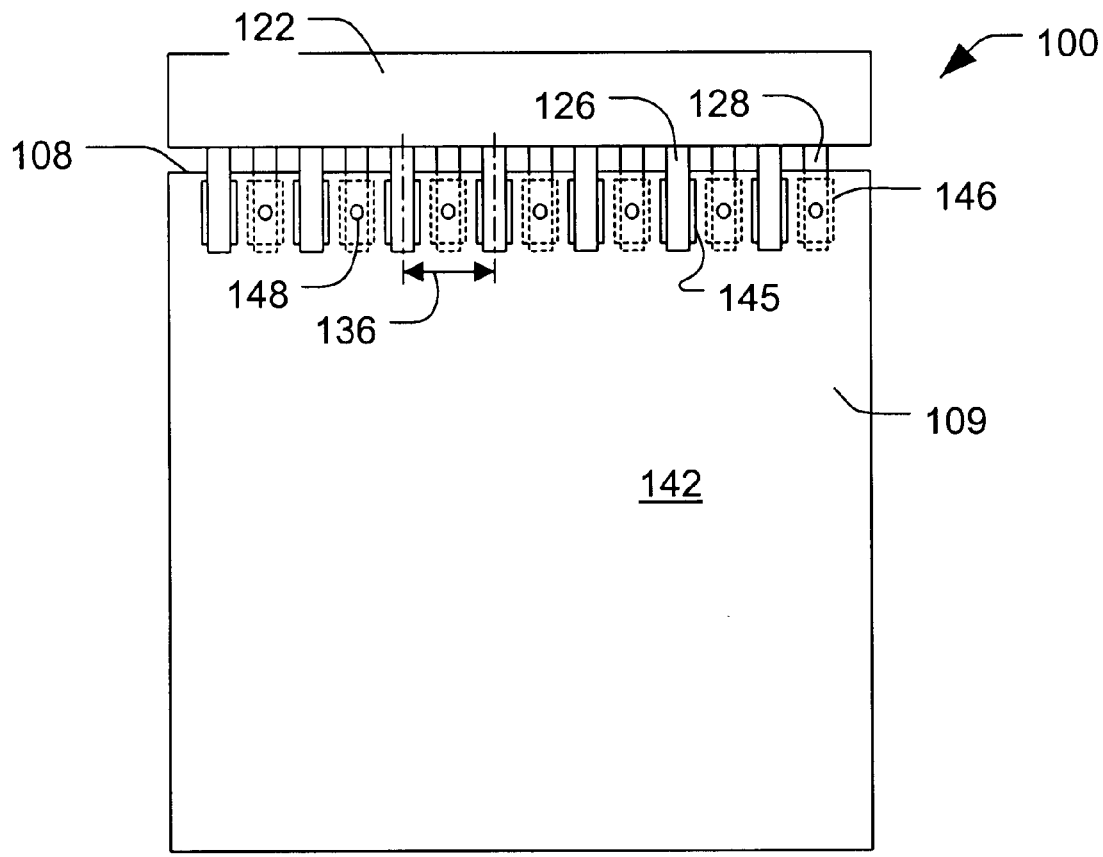
FIG. 3 is a simplified diagram of a most preferred embodiment of the PCBA.

A most preferred embodiment of the present invention is illustrated diagrammatically in FIG. 3. The connector leads are shown to be arranged along the length of the housing of a connector. First connector leads 126 extend from the housing 122 to abut the primary surface 142 of the PCB at the first contact pads 145. Second connector leads 128 extend from the housing to abut the secondary surface 144 of the PCB at the second contact pads 146. The primary surface is taken to be the surface on which most, if not all, of the devices are mounted, and thus the surface chosen for solder printing. The other surface is accordingly referred to as the secondary surface.

The second connector leads are preferably offset from the first connector leads in a direction substantially parallel to the edge of the PCB or to the length of the housing. In the most preferred embodiment, first connector leads and the second connector leads are arranged alternately along that direction. For a disc drive where the distance between neighboring connector leads of a conventional single sided straddle mount connector is less than 0.635 millimeters (25 mils), the distance 136 between neighboring connector leads contacting the same surface of the PCB can thus be doubled. The present invention therefore allows for wider spacing of the solder deposited without requiring a decrease in the number of connector leads since that is sometimes not a practicable option. It is observed that this new arrangement gives rise to significantly fewer solder defects such as bridging and insufficient solder.

Figure 4:
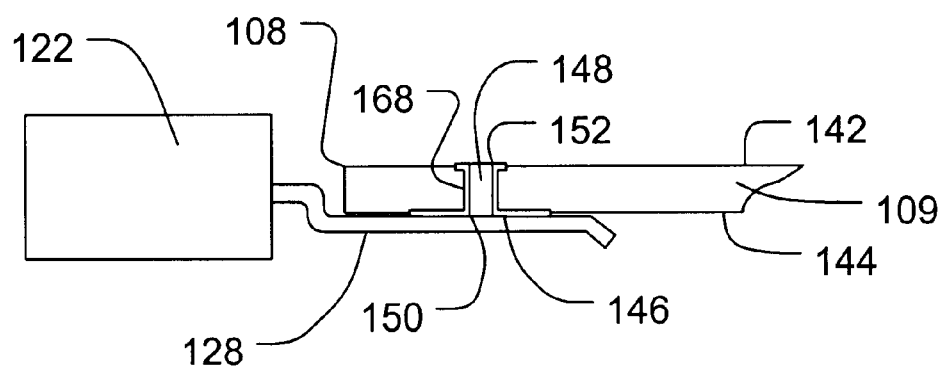
FIG. 4 shows in cross-section the position of a PTH in relation to a second contact pad and a second connector lead.

Positioned substantially in the middle of each second contact pad is at least one plated through hole (PTH) 148 leading to the primary surface. Each PTH is such that it has a second opening 150 directly within a second contact pad generally about where it is intended for the second connector lead to contact the second contact pad. In other words, the PTH is located directly at the location where it is intended for a solder joint to be formed between the second contact pad and the second connector lead, as shown in cross-sectional view of FIG. 4. Each PTH has a first opening 152 on the primary surface. Referring again to FIG. 3, the first openings are located no further away from the edge of the PCB than the first contact pads. Preferably, they are positioned between or beside the first contact pads.

Figure 5:
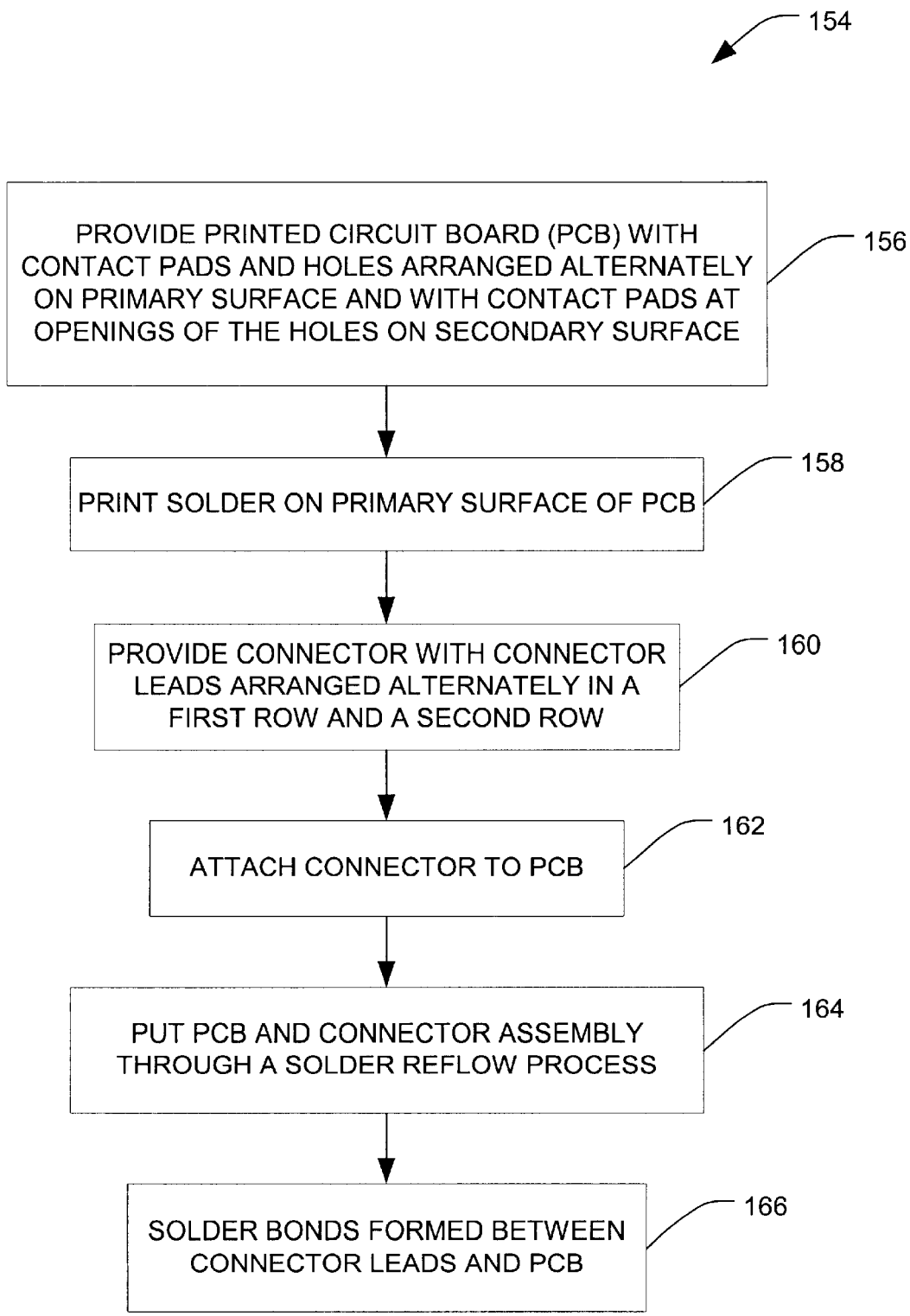
FIG. 5 is a process flow diagram to illustrate a preferred method of assembling the connector to the PCB.

The process of assembling the connector to the PCB is explained with the aid of a process flow diagram 154 given in FIG. 5. According to a most preferred embodiment of the invention, the process of assembling the connector to the PCB includes a step 156 of providing a PCB as described above.

Figure 6:
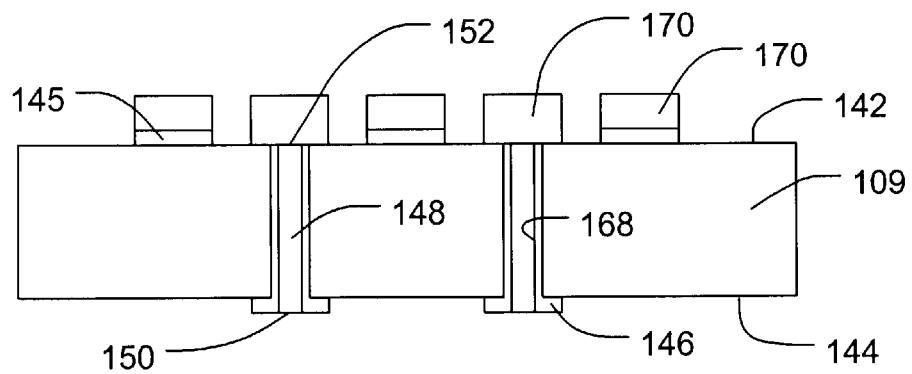
FIGS 6–8 shows the solder at various stages of the assembly process.

The next step 158 is to conduct one solder print on the primary surface of the PCB. This may involve the use of a stencil fabricated with apertures at certain specified positions. The stencil is positioned above the primary PCB surface such that apertures in the stencil are positioned above each first contact pad and also above each first opening of the PTH. Solder 170 is applied on the stencil and forced through the apertures in the stencil by a squeegee so that a desired amount of solder is deposited on the desired locations on the PCB. The PCB is then separated from the stencil. FIG. 6 shows a cross-section of the PCB with the solder deposits at this stage of the process. According to this invention, only one such solder printing process is required for the purpose of joining the connector to the PCB.

Figure 7:
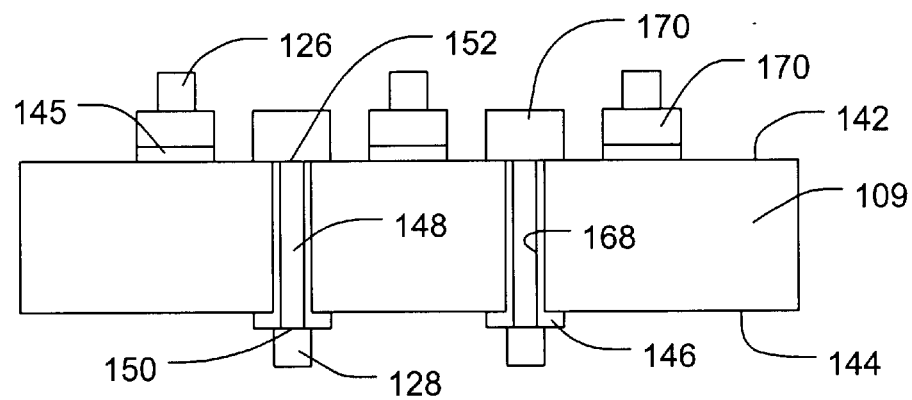

A connector of the present invention is provided in a step 160 and attached to the PCB in a step 162. The connector is positioned such that each first connector lead rests on the first contact pads on the primary surface, amidst the solder. The second connector leads rest on the second contact pads on the secondary surface, as shown in FIG. 7.

Figure 8:
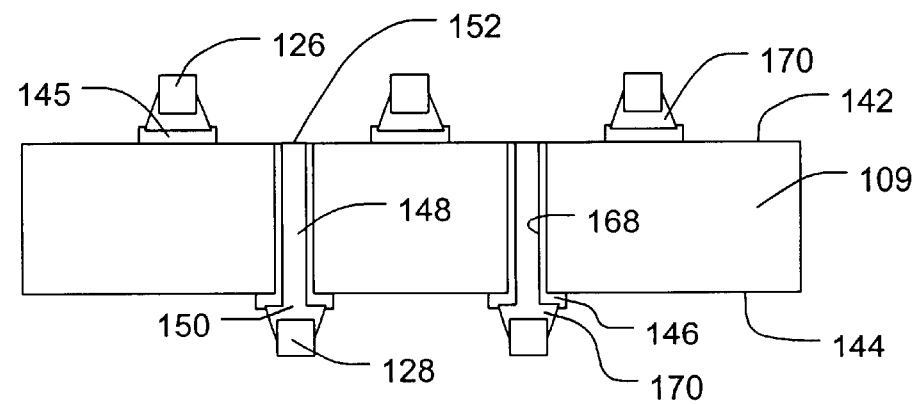

The PCB assembly is then put through a solder reflow process 164 where controlled heating is used to melt the solder. The solder that has been deposited on the first openings of the PTH travels down the PTH to make the required fillet formations between the second connector leads and the respective second contact pads on the secondary surface of the PCB. The PCB assembly is then allowed to cool, and as the solder solidifies, it bonds each connector lead to the respective contact pad. The resultant configuration is illustrated in FIG. 8. Solder joints are formed between each first connector lead and each corresponding first contact pad on the primary surface, whilst solder joints are also formed between each second connector lead and each corresponding second contact pad on the secondary surface of the PCB in a step 166.

Although it is within the scope of the present invention to use un-plated holes to channel the solder from one side of the PCB to the other, the use of PTH is preferred so as to provide better heat distribution to the solder and thus facilitate the flow of the solder to the desired location for bond formation. In addition, bonds are also formed between the metallic coating on the walls 168 of the PTH and the connector leads on the secondary surface of the PCB, thereby providing for stronger bonds than what is provided by the prior art.

The present invention provides for the PTH to be located directly above the desired location of bond formation, and this results in a number of significant improvements over the prior art. The PCB area that is taken up for forming the required connections to the connector is much less for the present invention than what is required for the prior art. In positioning the PTH near the edge of the PCB such that they are no further away from the edge than the first contact pads. The PCB area that needs to be set aside for joining the connector to the PCB is therefore no more than what is required for the connector leads or the gripper arms. In other words, the present invention requires a minimal amount of PCB area for assembling the connector to the PCB. More significantly, more PCB area can be freed up for other use or the product can be further compacted.

Another improvement lies in the solder bond formation. Because the PTH can now be located directly above the eventual location of the bond, the deposited solder need only to flow down the PTH by the force of gravity and capillary action. This downward flow is further facilitated by the heated metallized wall of the PTH. Once the solder reaches the second opening, it is already at the location where bond formation is desired. The result is a more consistent fillet formation all round the joint. It was a problem with the prior art that the solder did not flow across the PCB surface adequately all round the desired joint location, and often resulting in insufficient solder for proper fillet formation, especially at the side of the joint that is further away from the source of the solder.

Furthermore, in the prior art, some of the solder remains in the reservoir or in the hole, and therefore does not contribute to bond formation. In contrast, the present invention maximizes the utilization of the solder deposited even when some solder remains in the PTH because there is additional bonding between the metallic wall of the PTH and the connector lead.

Alternatively, preferred embodiments of the invention may be described as follows:

The present invention provides for a printed circuit board assembly 100 which has a connector 106 mounted along an edge 108 of a printed circuit board 109. A primary surface 142 of the printed circuit board 109 has first contact pads 145 and a secondary surface 144 has second contact pads 146. Holes 148 are formed in the printed circuit board 109 such that each of the holes has a first opening 152 on the primary surface 142 and a second opening 150 on the secondary surface 144. The connector 106 includes a housing 122 from which extends first connector leads 126 and second connector leads 128. The first connector leads 126 are configured for abutment with the primary surface 142 at the first contact pads 145 whereas the second connector leads 128 are configured for abutment with the secondary surface 144 at the second contact pads 146, wherein the second openings 150 coincide with the second contact pads 146. The holes 148 may have plated walls 168.

According to one embodiment, the first openings 152 are located no further away from the edge 108 than the first contact pads 145. In a preferred embodiment, the first connector leads 126 are offset from the second connector leads 128 in a direction substantially parallel to the edge. The first connector leads 126 and the second connector leads 128 may also be arranged alternately along the direction substantially parallel to the edge.

In another aspect, the method of making the printed circuit board assembly 154 includes printing solder on only the primary surface 158 before mounting the connector to the printed circuit board 160. The printed circuit board and the connector are then subjected to a solder reflow process 164 during which bonds are formed 166.

Solder printing 158 may be carried out by using a stencil which has third apertures and fourth apertures. The printed circuit board 109 is positioned below the stencil such that the third apertures are above the first contact pads 145 and the fourth apertures are above the first openings 152 of the holes 148 in the printed circuit board. Solder is then applied on the stencil and forced through the third apertures and the fourth apertures such that solder is deposited on the first contact pads and the first openings of the holes in the printed circuit board. The printed circuit board can then be separated from the stencil before solder reflow.

Solder bonds can thus be formed between the first connector leads 126 and the first contact pads 145, and also between the second connector leads 128 and the second contact pads 146.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the connector leads need not necessarily extend from the housing in two rows. One skilled in the art will understand the scope of the invention to include connector leads which are configured differently from that illustrated in the drawings. In addition, although the preferred embodiment is described herein with reference to a disc drive, it will be appreciated by those skilled in the art that the teachings of the present invention can be applied to other systems, like compact disc equipment and video equipment, without departing from the scope and spirit of the present invention.

We claim:

1. A printed circuit board assembly comprising:

a printed circuit board comprising:
   a longitudinally extending edge;
   a primary surface with first contact pads extending along the primary surface;
   a secondary surface with second contact pads extending along the secondary surface; and
   holes, each of the holes having a first opening on the primary surface and a second opening on the secondary surface; and a connector mounted along the edge, the connector comprising:
   a housing;
   first connector leads extending from the housing and configured for abutment with the primary surface at the first contact pads; and
   second connector leads extending from the housing and configured for abutment with the secondary surface at the second contact pads, wherein the second openings are substantially surrounded by the second contact pads.

2. A printed circuit board assembly of claim 1 wherein the holes further include plated walls.

3. A printed circuit board assembly of claim 1 wherein the first openings are no further away from the edge than the first contact pads.

4. A printed circuit board assembly of claim 3 wherein each of the first connector leads is offset from each of the second connector leads in a direction substantially parallel to the longitudinal extension of the edge.

5. A printed circuit board assembly of claim 4 wherein the first connector leads and the second connector leads are arranged alternately along the direction substantially parallel to the edge.

6. A method of assembling a printed board assembly comprising steps of:

(a) providing a printed circuit board comprising:
   an edge;
   a primary surface with first contact pads extending along the primary surface;
   a secondary surface with second contact pads extending along the secondary surface; and
   holes, each of the holes having a first opening on the primary surface and a second opening on the secondary surface;

(b) providing a connector comprising:
   a housing;
   first connector leads extending from the housing and configured for abutment with the primary surface at the first contact pads; and
   second connector leads extending from the housing and configured for abutment with the secondary surface at the second contact pads, wherein the second openings are substantially surrounded by the second contact pads; and (c) mounting the connector along the edge of the printed circuit board.

7. A method of claim 6 further comprising steps of (d) printing solder on only the primary surface before the mounting step (c); and (e) subjecting the printed circuit board and the connector to a solder reflow process after the mounting step (c).

8. A method of claim 7 wherein the printing step (d) includes steps of:

(f) providing a stencil having third apertures and fourth apertures;

(g) positioning the printed circuit board below the stencil such that the third apertures are above the first contact pads and the fourth apertures are above the first openings of the holes in the printed circuit board;

(h) applying solder on the stencil;

(i) forming the solder through the third apertures and the fourth apertures such that solder is deposited on the first contact pads and the first openings of the holes in the printed circuit board; and (j) separating the printed circuit board from the stencil.

9. A method of claim 7 wherein the step (e) includes steps of:

(k) forming solder bonds between the first connector leads and the first contact pads; and (l) forming solder bonds between the second connector leads and the second contact pads.

* * * * *